United States Patent
Watabe et al.

(10) Patent No.: US 10,276,812 B2
(45) Date of Patent: Apr. 30, 2019

(54) DISPLAY DEVICE AND MANUFACTURING METHOD THEREOF

(71) Applicant: Japan Display Inc., Minato-ku (JP)

(72) Inventors: Kazufumi Watabe, Minato-ku (JP);
Toshihiro Sato, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/355,194

(22) Filed: Nov. 18, 2016

(65) Prior Publication Data

US 2017/0229664 A1    Aug. 10, 2017

(30) Foreign Application Priority Data

Feb. 10, 2016  (JP) .................................. 2016-023783

(51) Int. Cl.
| | |
|---|---|
| *H01L 33/00* | (2010.01) |
| *H01L 51/00* | (2006.01) |
| *H01L 51/52* | (2006.01) |
| *H01L 51/56* | (2006.01) |
| *H01L 27/32* | (2006.01) |

(52) U.S. Cl.
CPC ........ *H01L 51/0097* (2013.01); *H01L 51/003* (2013.01); *H01L 51/5246* (2013.01); *H01L 51/5253* (2013.01); *H01L 51/56* (2013.01); *H01L 27/3276* (2013.01); *H01L 51/0024* (2013.01); *H01L 2227/326* (2013.01); *H01L 2251/566* (2013.01); *Y02E 10/549* (2013.01)

(58) Field of Classification Search
CPC ............. H01L 51/0024; H01L 51/5253; H01L 51/5246
See application file for complete search history.

(56) References Cited

U.S. PATENT DOCUMENTS

| | | | |
|---|---|---|---|
| 2007/0170846 A1* | 7/2007 | Choi | H01L 51/5246 313/504 |
| 2010/0244005 A1* | 9/2010 | Gyoda | H01L 51/5237 257/40 |
| 2014/0042408 A1 | 2/2014 | Akagawa et al. | |
| 2015/0044791 A1* | 2/2015 | Chaji | H01L 51/0024 438/26 |

FOREIGN PATENT DOCUMENTS

JP    2014-35799    2/2014

* cited by examiner

*Primary Examiner* — Samuel A Gebremariam
(74) *Attorney, Agent, or Firm* — Oblon, McClelland, Maier & Neustadt, L.L.P.

(57) ABSTRACT

Simple and high-precision processing, and narrowing of the frame are to be facilitated at the time of preparing display panels by multiple formation. After bonding a first substrate layer in which a plurality of element substrates is formed on a support plate and a second substrate layer in which a plurality of counter substrates is formed on a support plate, these substrate layers are divided into a plurality of display panels. Ridge-like ribs of a covalently or ionically bonding inorganic material are formed along edges of the element substrate and the counter substrate. The dividing includes scribing the support plates along the ribs, and flexing and breaking the support plates.

4 Claims, 6 Drawing Sheets

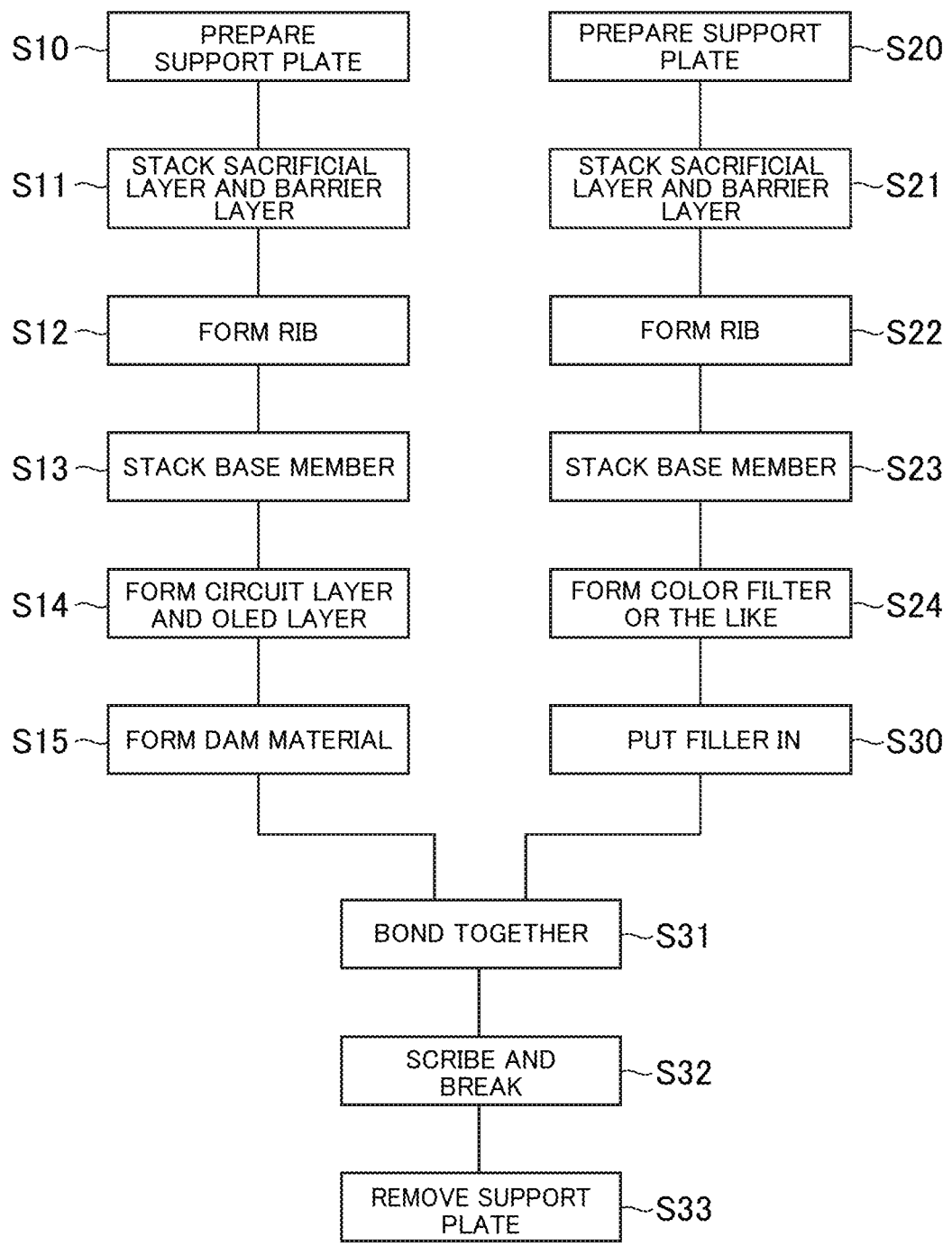

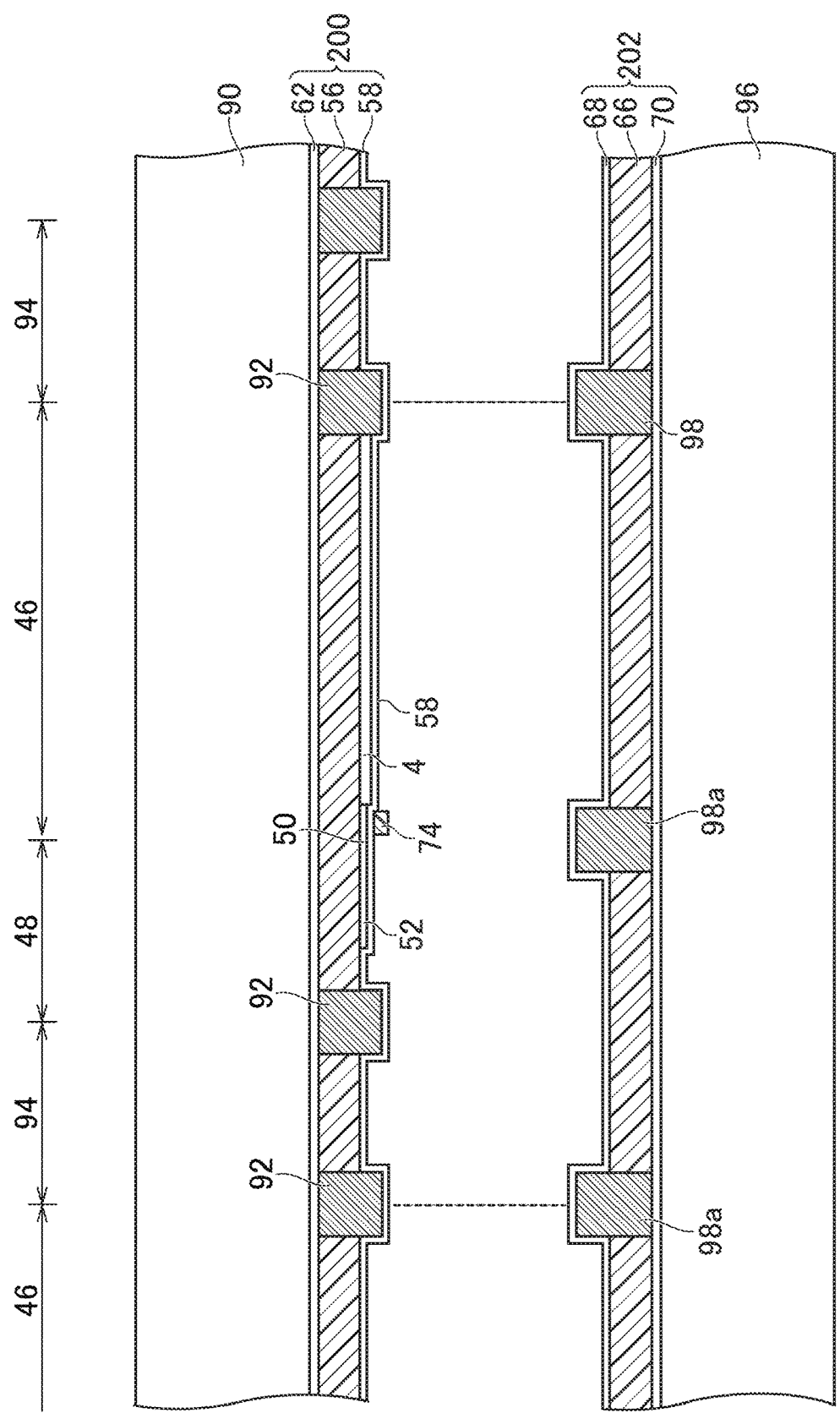

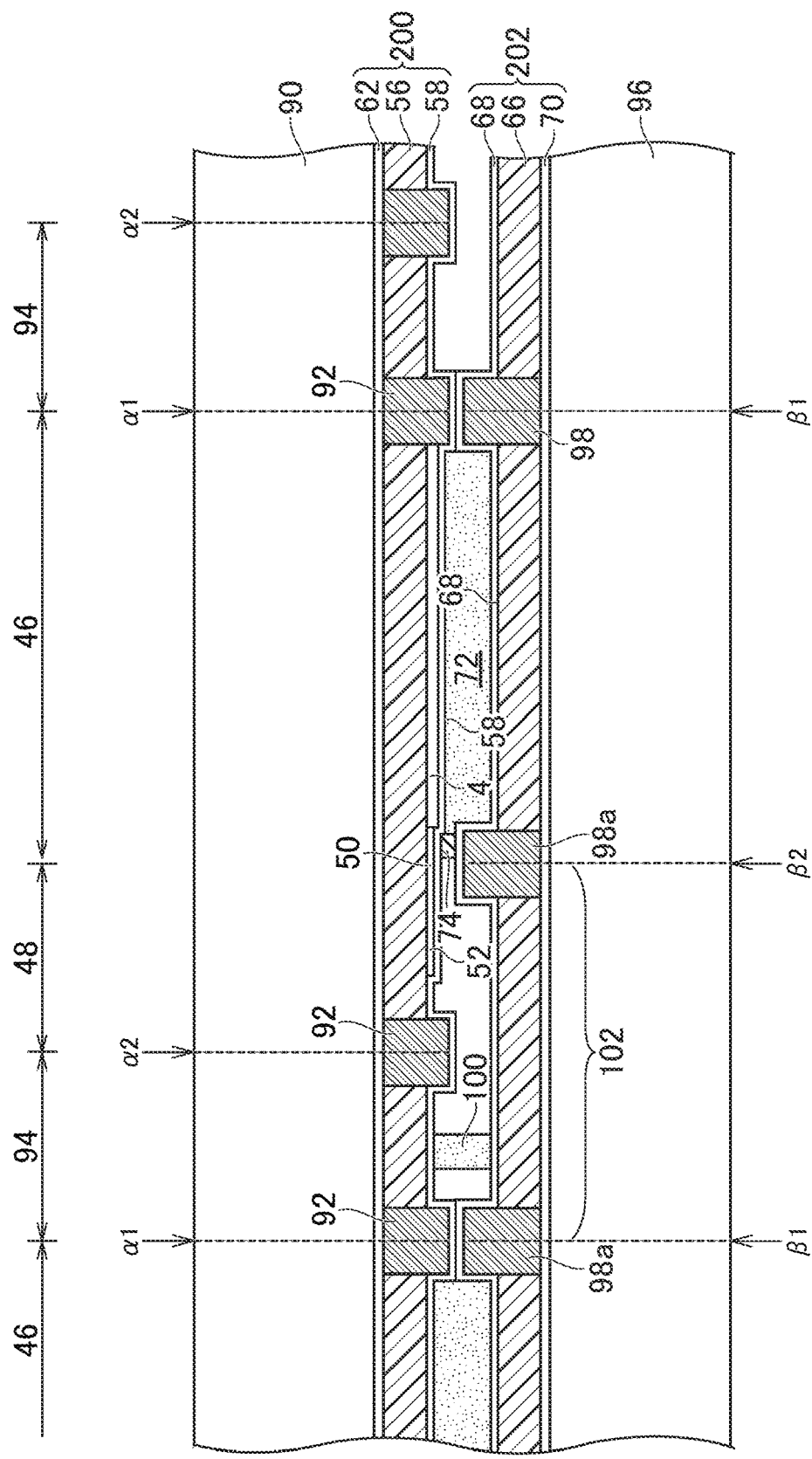

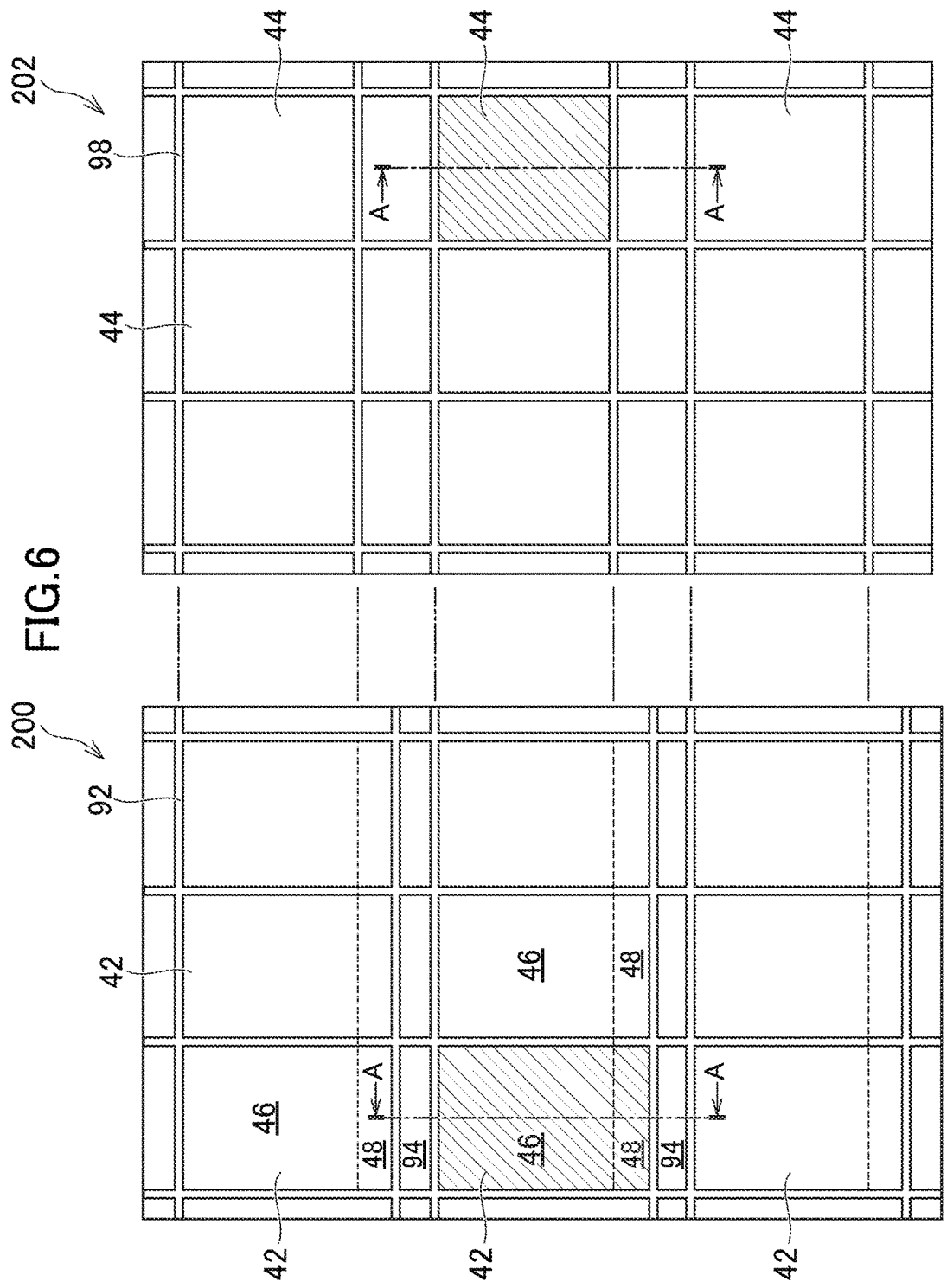

DISPLAY DEVICE AND MANUFACTURING METHOD THEREOF

CROSS-REFERENCE TO RELATED APPLICATION

The present application claims priority from Japanese application JP2016-023783 filed on Feb. 10, 2016, the content of which is hereby incorporated by reference into this application.

BACKGROUND OF THE INVENTION

1. Field of the Invention

The present invention relates to a display device and a manufacturing method thereof, and particularly to a flexible display.

2. Description of the Related Art

A flat panel display such as an organic electroluminescence (EL) display device has a display panel in which a thin film transistor (TFT), an organic light-emitting diode (OLED) and the like are formed on a substrate. Conventionally, a glass substrate is used for the base member of the display panel. However, recently, the development of a flexible display using a resin film or the like as the base member to enable the flexure of the display panel is under way.

As a structure of the organic EL display device, an element substrate having a display area where an OLED as a display element is formed, and a counter substrate on which a color filter or the like is formed and which is arranged opposite the display area of the element substrate, are bonded together. To secure reliability, the element substrate and the counter substrate are bonded together with a filler held between these substrates. In this case, a method may be used in which a dam having a convex structure is formed at an outer peripheral part of the counter substrate, then the filler is dripped into the dam, and the element substrate and counter substrate are thus bonded together. This dam plays the role of preventing the filler from protruding to the outside. The dam is formed by applying a fluid material onto the outer perimeter of the panel with a dispenser or the like and then hardening the fluid material.

Also, a layer (substrate layer) in which a plurality of the flexible element substrates and counter substrates are arranged is formed on a support plate such as a glass substrate, and after the two substrates are bonded together on each support plate, the resulting structure is divided into a plurality of display panels.

SUMMARY OF THE INVENTION

In order to achieve a narrow frame on a high-definition display panel, a dam needs to be patterned with a smaller width and higher precision. However, with the technique of dripping the dam material from the nozzle of the dispenser, high-precision patterning is difficult.

Also, the dam material dripped from the dispenser and hardened is relatively flexible and will not easily crack. Therefore, when dividing the integrally formed plurality of display panels into the individual display panels, laser cutting or the like is used, and a relatively simple technique such as scribe and break cannot be used.

The invention is to provide a display panel which can be processed with higher precision by a simpler technique, when producing display panels by a so-called multiple formation, that is, stacking a substrate disposed a plurality of element substrates and a substrate disposed a plurality of counter substrates and then dividing the stacked substrate into a plurality of display panel, and in which the frame can be narrowed by reducing redundant areas between the substrates, and a manufacturing method thereof.

A display device according to an aspect of the invention includes: an element substrate including a flexible multilayer structure having a resin film as a base member, and having a display area where a display element is formed; a counter substrate including a flexible multilayer structure having a resin film as a base member, and stacked on the display area of the element substrate; and a filler filling a space between the element substrate and the counter substrate. Each of the element substrate and the counter substrate has a rib which includes a covalently or ionically bonding inorganic material and which is in contact with an outer peripheral lateral surface of the multilayer structure.

A manufacturing method of a display device according to another aspect of the invention is a manufacturing method of a display device having a flexible element substrate including a display area where a display element is formed, and a flexible counter substrate bonded to the display area of the element substrate with a filler held between the substrates. The manufacturing method includes: forming a first substrate layer in which a plurality of the element substrate is arranged, on one main surface of a first support plate; forming a second substrate layer in which the counter substrate is provided at each position facing the display area of each of the element substrates in the first substrate layer, on one main surface of a second support plate; bonding the first substrate layer on the first support plate to the second substrate layer on the second support plate and thus forming a substrate layer joined body; and dividing the first substrate layer together with the first support plate, dividing the second substrate layer together with the second support plate, and thereby dividing the substrate layer joined body held between the first and second support plates, into a plurality of parts, each part corresponding to the display device. The forming of the first substrate layer includes forming a ridge-like first rib including a covalently or ionically bonding inorganic material along an edge of the element substrate. The forming of the second substrate layer includes forming a counter area part made of a material including a flexible resin film and arranged opposite the display area, and a second rib including a covalently or ionically bonding inorganic material and in the form of a ridge surrounding the counter area part and higher than the counter area part. The bonding includes filling, with a filler, a recess part in the second substrate layer generated at the counter area part due to a height difference from the second rib. The dividing includes scribing the first and second support plates along the first and second ribs, and flexing and breaking the first and second support plates that are scribed.

BRIEF DESCRIPTION OF THE DRAWINGS

FIG. 3 is a schematic process flowchart of the manufacturing method of the organic EL display device according to the embodiment of the invention.

FIG. 4 is a schematic vertical cross-sectional view of each of a first substrate layer after the completion of a first substrate layer forming process, and a second substrate layer after the completion of a second substrate layer forming process.

FIG. 5 is a schematic vertical cross-sectional view of the state where the first substrate layer and the second substrate layer are bonded together.

FIG. 6 is a schematic plan view of the first substrate layer and the second substrate layer.

DETAILED DESCRIPTION OF THE INVENTION

Hereinafter, a form of embodying the invention (hereinafter referred to as an embodiment) will be described with reference to the drawings.

The disclosure is only an example, and as a matter of course, any change that can be easily thought of by a person skilled in the art without departing from the spirit of the invention should be included in the scope of the invention. In order to clarify the explanation, the drawings may schematically show each part in terms of its width, thickness, shape and the like, compared with the actual configuration. However, this is simply an example and should not limit the interpretation of the invention. Also, elements similar to those described before with reference to already mentioned drawings may be denoted by the same reference signs, and detailed description of these elements may be omitted when appropriate.

The display device according to the embodiment of the invention is an organic EL display device. The organic EL display device is an active-matrix display device and is installed in a television, personal computer, mobile terminal, mobile phone and the like.

Figure 1:
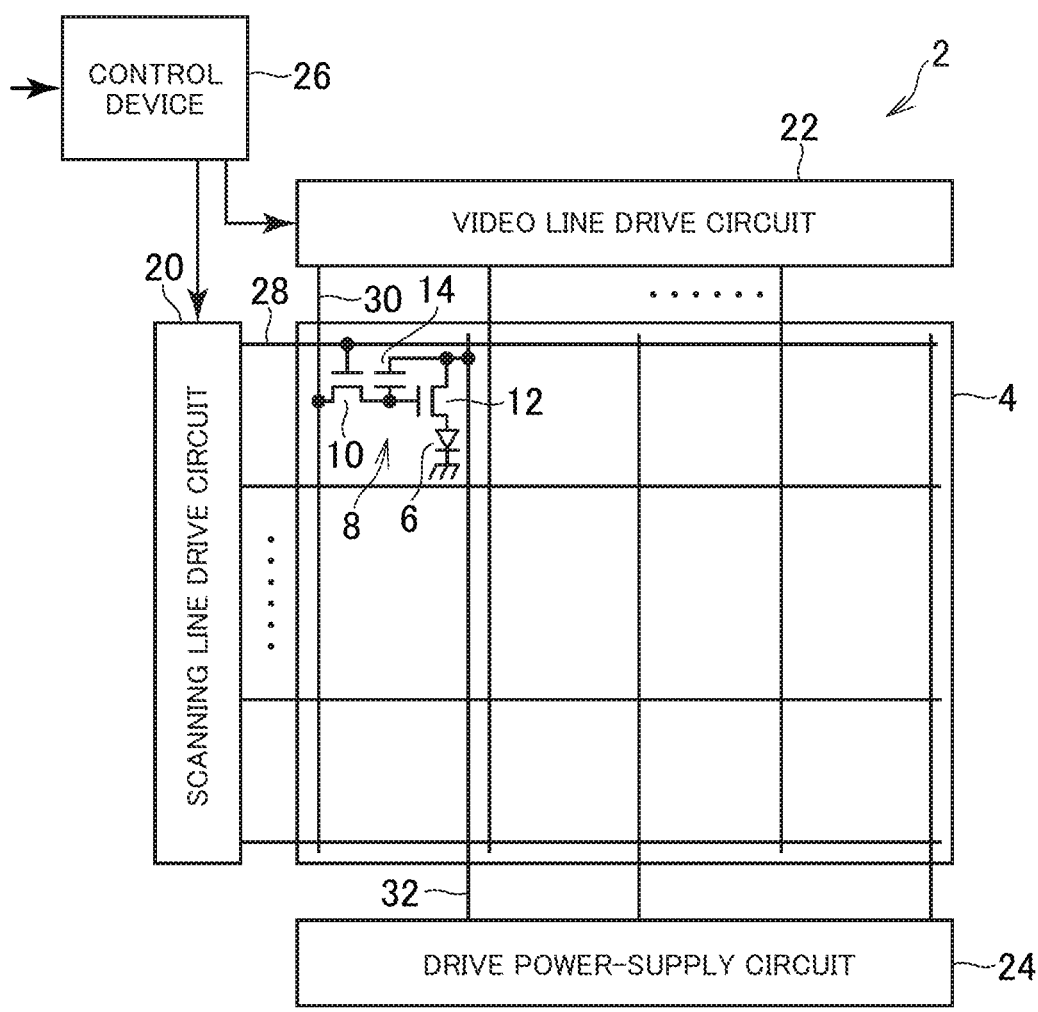
FIG. 1 is a schematic view showing a schematic configuration of an organic EL display device according to an embodiment of the invention.

FIG. 1 is a schematic view showing a schematic configuration of an organic EL display device 2 according to the embodiment. The organic EL display device 2 has a pixel array part 4 which displays an image, and a drive unit which drives the pixel array part 4. The organic EL display device 2 is a flat panel display and has a display panel. The display panel includes a display area where the pixel array part 4 is arranged, and a non-display area.

In the pixel array part 4, an OLED 6 as a display element and a pixel circuit 8 are arranged in the form of a matrix corresponding to pixels. The pixel circuit 8 is made up of a plurality of TFTs 10, 12 and a capacitor 14.

Meanwhile, the drive unit includes a scanning line drive circuit 20, a video line drive circuit 22, a drive power-supply circuit 24, and a control device 26. The drive unit drives the pixel circuit 8 to control the light emission of the OLED 6.

The drive unit can be arranged in the non-display area of the display panel. The drive unit can be formed on the element substrate forming the display panel together with the pixel circuit 8. Also, the drive unit may be put in an integrated circuit (IC) produced separately from the pixel circuit 8, and this IC may be installed within the display panel or on a flexible printed circuit (FPC) connected to the display panel.

The scanning line drive circuit 20 is connected to a scanning signal line 28 provided for each horizontal line of pixels (pixel row). The scanning line drive circuit 20 sequentially selects a scanning signal line 28 in response to a timing signal inputted from the control device 26, and applies a voltage to switch on the lighting TFT 10, to the selected scanning signal line 28.

The video line drive circuit 22 is connected to a video signal line 30 provided for each vertical line of pixels (pixel column). The video line drive circuit 22 has a video signal inputted from the control device 26, and outputs a voltage corresponding to the video signal for the selected pixel row to each video signal line 30, simultaneously with the selection of the scanning signal line 28 by the scanning line drive circuit 20. This voltage is written in the capacitor 14 via the lighting TFT 10, in the selected pixel row. The drive TFT 12 supplies a current corresponding to the written voltage to the OLED 6, and this causes the OLED 6 of the pixel corresponding to the selected scanning signal line 28 to emit light.

The drive power-supply circuit 24 is connected to a drive power-supply line 32 provided for each pixel column, and supplies a current to the OLED 6 via the drive power-supply line 32 and the drive TFT 12 in the selected pixel row.

Here, the anode of the OLED 6 is connected to the drive TFT 12. Meanwhile, the cathode of each OLED 6 is basically connected to the ground potential, and the cathodes of the OLEDs 6 of all the pixels are formed by a common electrode.

Figure 2:
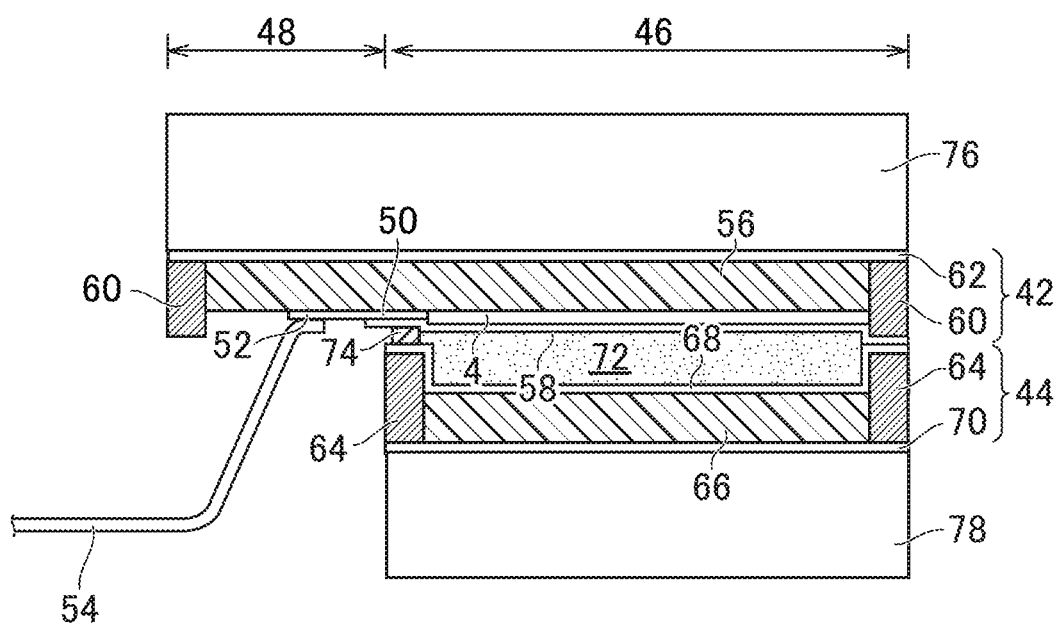
FIG. 2 is a schematic vertical cross-sectional view of a display panel according to the embodiment of the invention.

FIG. 2 is a schematic vertical cross-sectional view of a display panel 40. The display panel 40 includes an element substrate 42 and a counter substrate 44 bonded to each other.

The element substrate 42 has a display area 46 and a non-display area 48. In the display area 46 of the element substrate 42, the pixel array part 4 is provided as already described. In the non-display area 48, a wiring 50 led out of the pixel array part 4 in the adjacent display area 46 is formed. Also, in the non-display area 48, a terminal 52 for connecting the drive unit to the wiring 50 or a circuit of the drive unit can be formed, and an IC can be arranged. FIG. 2 shows an example in which an FPC 54 is connected to the terminal 52 provided in the non-display area 48.

The pixel array part 4, the wiring 50, the terminal 52 and the like are formed on one main surface of a base member 56 made of a flexible resin film. For example, the base member 56 can be formed using polyimide, epoxy, acrylic, polyethylene naphthalate, and a thermoplastic fluorine resin such as tetrafluoroethylene-ethylene copolymer.

The pixel array part 4 has a multilayer structure including a circuit layer in which electronic circuits such as the pixel circuit 8, the scanning signal line 28, the video signal line 30, and the drive power-supply line 32 are formed, and an OLED layer in which an OLED is formed, or the like. The OLED layer includes a pixel electrode, an organic material multilayer part, a common electrode, and a bank. The pixel electrode, the common electrode, and the organic material multilayer part held between these electrodes form the OLED. Also, basically, the common electrode contacts the organic material multilayer parts of all the pixels in the display area. Meanwhile, the pixel electrode is formed separately for each pixel and is connected to the drive TFT 12 shown in FIG. 1 and formed in the circuit layer. The common electrode and the pixel electrode is formed using a transparent conductive material such as IZO (indium zinc oxide) or ITO (indium tin oxide). The organic material multilayer part has a light emitting layer. The light emitting layer has holes and electrons injected therein in response to the voltage applied to both electrodes, and emits light due to the recombination of these holes and electrons.

The OLED layer is stacked on the circuit layer, and a cover layer 58 is stacked on the OLED layer. The cover layer 58 is made of a film with a moisture-proof function and protects the OLED from property deterioration due to moisture. For example, a layer made of silicon nitride (SiN) is stacked as the cover layer 58.

An end part 60 made of a covalently bonding inorganic material or an ionically bonding inorganic material is in tight contact with the outer peripheral lateral surface of the base member 56. The end part 60 has a moisture-proof function on the lateral surface of the base member 56 or the like. Also, the back side of the element substrate 42, that is, the side opposite to the side where the pixel array part 4 is formed, of the base member 56, is covered by a barrier layer 62 having a moisture-proof function.

The counter substrate 44 is stacked on the display area 46 of the element substrate 42. The counter substrate 44 has a counter area part which is arranged opposite the display area 46, and an end part 64 which surrounds the counter area part and is higher than the counter area part. The counter area part has a multilayer structure using a flexible resin film as a base member 66, and a color filter and a barrier layer (hereinafter these two are collectively referred to as a color filter layer 68) and the like are stacked on one main surface of the base member 66. The base member 66 can be formed using the materials mentioned above with respect to the base member 56, for example. The end part 64 is made of a covalently bonding inorganic material or an ionically bonding inorganic material and is in tight contact with the outer peripheral lateral surface of the base member 66. The end part 64 has a moisture-proof function on the lateral surface of the base member 66 and the like. Also, the back side of the counter substrate 44, that is, the side opposite to the side where the color filter layer 68 is formed, of the base member 66, is covered by a barrier layer 70 having a moisture-proof function.

In the element substrate 42, the cover layer 58 may cover the base member 56 in an area excluding the wiring 50, of the non-display area 48. Also, an underlying layer made up of a silicon nitride film and a silicon oxide film may be provided between the pixel array part 4 and the base member 56, and this underlying layer may exist in the entirety of the display area 46 and the non-display area 48. Since the cover layer 58, the end part 60, the barrier layer 62, and the underlying layer, which do not easily pass oxygen or moisture through, are thus provided on the top surface, the bottom surface, and the lateral surface of the base member 56, moisture or oxygen does not enter the base member 56. Similarly, in the base member 66 of the counter substrate 44, since the color filter layer 68, the end part 64, and the barrier layer 70, which do not easily pass moisture or oxygen through, are provided on the top surface, the bottom surface, and the lateral surface, moisture or oxygen does not enter the base member 66.

The element substrate 42 and the counter substrate 44 are bonded together in such a way that the surface where the pixel array part 4 and the like are formed, of the element substrate 42, and the surface where the color filter layer 68 is formed, face each other. Here, the surface where color filter layer 68 is formed, of the counter substrate 44, is a recess part in the counter area part due to the height difference between the end part 64 and the counter area part. This recess part is filled with a filler 72 when bonding the two substrates 42, 44 together. The filler 72 fills the space between the element substrate 42 and the counter substrate 44 and hardens and thus bonds the two substrates together.

In the part where the edge of the element substrate 42 and the edge of the counter substrate 44 coincide with each other, the top surface of the end part 60 and the top surface of the end part 64 face each other. In this part, the two substrate 42, 44 are in tight contact with each other, preventing the filler 72 from leaking out. Meanwhile, in the part where the edge of the counter substrate 44 and the edge of the element substrate 42 do not coincide with each other, specifically, in the boundary part between the display area 46 and the non-display area 48 of the element substrate 42, a dam material 74 is stacked on the element substrate 42 in order to prevent the formation of a space between the top surface of the end part 64 and the top surface of the element substrate 42 and the entry of the filler 72 into the space.

To protect the joined body of the element substrate 42 and the counter substrate 44, protection films 76, 78 are bonded onto the outer surfaces of the substrates, that is, onto the barrier layers 62, 70.

Next, the manufacturing method of the organic EL display device 2 will be described. The manufacturing method of the organic EL display device 2 according to the invention is characterized by the manufacturing method of the display panel 40. In this manufacturing method, the multilayer structures of a plurality of display panels 40 are formed integrally.

FIG. 3 is a schematic process flowchart of the manufacturing method. This process flow is made up of a series of steps for forming a first substrate layer in which the structures of a plurality of element substrates 42 are arranged on one main surface of a first support plate (first substrate layer forming process: Steps S10 to S15), a series of steps for forming a second substrate layer in which the structure of each counter substrate 44 is provided at a position facing the display area 46 of each element substrate 42 in the first substrate layer, on one main surface of a second support plate (second substrate layer forming process: Steps S20 to S24), and a series of steps (Steps S30 to S33) for assembling the first substrate layer and the second substrate layer into the display panel 40.

FIG. 4 is a schematic vertical cross-sectional view of the first substrate layer after the completion of the first substrate layer forming process and the second substrate layer after the completion of the second substrate forming process. In this illustration, the direction of and horizontal positional relation between the two substrate layers are the same as those at the time of bonding these substrate layers. FIG. 5 is a schematic cross-sectional view of the state where the two substrate layers are bonded together.

FIG. 6 is a schematic plan view of a first substrate layer 200 and a second substrate layer 202. The position of the cross section shown in FIGS. 4 and 5 is the same as in FIG. 2, and this position is indicated by a segment A-A in FIG. 6. In FIG. 6, one element substrate 42 arranged in the first substrate layer 200 and one counter substrate 44 arranged in the second substrate layer 202 are indicated by hatching. The element substrate 42 has a rectangular planar shape. In FIG. 6, the area above the dotted line in this rectangle is the display area 46, and the area below the dotted line is the non-display area 48. The counter substrate 44 has a rectangular planar shape, too, and has a shape basically coincident with the display area 46 of the element substrate 42. When the first substrate layer 200 and the second substrate layer 202 are bonded together, three sides of the four sides forming the outline of the counter substrate 44 overlap with the outline of the element substrate 42, and the remaining one side is situated at the boundary between the display area 46 and the non-display area 48.

Since the element substrate 42 is flexible, a support plate 90 which holds the element substrate 42 in a flat state is prepared at the beginning of the first substrate layer forming process (Step S10). As the support plate 90, a material suitable for the scribe and break technique is used. For example, the support plate 90 is formed using glass. In this embodiment, in order to produce a plurality of display panels 40 in one shot as described above, the support plate 90 in a shape and size that allows a plurality of element substrate 42 to be arranged thereon is prepared. In the example shown in FIG. 6, three by three element substrates 42, in the directions of length and width, are arranged on the support plate 90.

First, the first substrate layer forming process will be described. A sacrificial layer (not illustrated) used at the time of stripping the element substrate 42 from the support plate 90, and the barrier layer 62 having a moisture-proof function are stacked in order on the support plate 90 (Step S11). The sacrificial layer is preferably made of a metal or metal oxide. Titanium (Ti), tungsten (W) or oxides thereof may be used. The barrier layer 62 is made up of a silicon nitride film, silicon oxide film, silicon carbonitride film, silicon carbide film, or multilayer structure of these films.

A ridge-like first rib 92 is formed using a covalently or ionically bonding inorganic material, on the barrier layer 62 along the edge of the element substrate 42 (Step S12). In FIG. 6, the element substrate 42 is in contact with the edge of the adjacent element substrate 42, and these element substrates 42 share the rib 92 provided along the side in the direction of length. Meanwhile, in the example of FIG. 6, since a margin area 94 is provided between the element substrates 42 next to each other in the direction of length, the rib 92 provided along the side in the direction of width of the element substrates 42 is not shared between the element substrates 42.

As a method for forming the rib 92, patterning using a photolithography technique, a printing method, an aerosol deposition method, sheet pasting or the like can be used. Incidentally, the aerosol deposition method is a high-speed coating method in which fine particles of ceramics, metal or the like as a powder material are sprayed, thus enabling solidification and densification at room temperature without needing a binder or pre-heating of the base member. The rib 92 is formed of a covalently or ionically bonding inorganic material as described above, due to its characteristic of being susceptible to cracking, compared with an organic material like resin or a metal, and therefore suitable for the scribe and break technique. For example, the rib 92 is formed of SiN, silicon oxide (SiO), ITO or the like. Moreover, the same material as the sacrificial layer may be used for the rib 92, and a metal oxide or metal nitride may be used. A material that can easily crack and does not easily pass water and oxygen through is preferable for the rib 92. The thickness (height) of the rib 92 is set to be basically the same as or slightly greater than the thickness of the multilayer structure that is subsequently formed in the area surrounded by the rib 92.

In the area surrounded by the rib 92, the base member 56 of the flexible resin film is stacked (Step S13). Further thereon, the circuit layer of the pixel array part 4, the OLED layer and the like are formed in the display area 46, whereas the wiring 50, the terminal 52 and the like are formed in the non-display area 48, and the cover layer 58 is formed thereon (Step S14).

After the main structure of the element substrate 42 such as the pixel array part 4 and the wiring 50 is formed on the base member 56 in Step S14, the dam material 74 (seal part) having a thickness corresponding to the height difference between the position of the rib 92 and an area arranged opposite the end part 64 of the counter substrate 44 at the boundary between the display area 46 and the non-display area 48 is formed in this area (Step S15). Thus, the first substrate layer 200 is formed on the surface of the support plate 90.

Next, the second substrate layer forming process will be described. In this process, as in the first substrate layer forming process, a support plate 96 is prepared (Step S20), and a sacrificial layer (not illustrated) and the barrier layer 70 are stacked thereon in order (Step S21). Also, a ridge-like second rib 98 is formed using a covalently or ionically bonding inorganic material, on the barrier layer 70 along the edge of the counter substrate 44 (Step S22). The rib 98 can be formed using a technique and material that are basically similar to those of the rib 92. The thickness (height) of the rib 98 is set to be basically greater than the thickness of the multilayer structure subsequently formed in the area (counter area part) surrounded by the rib 98. The same material as the barrier layer 62 may be used for the barrier layer 70, and the same material as the material used at the time of forming the first substrate layer may be used for the sacrificial layer.

Also, in FIG. 6, since the counter substrate 44 is stacked on the display area 46 of the element substrate 42, the counter substrates 44 next to each other in the direction of width are in contact with each other at the edge, similarly to the element substrates 42, and these counter substrates 44 share the rib 98 provided along the side in the direction of length, whereas the rib 98 provided along the side in the direction of width is not shared between the counter substrates 44.

In the area surrounded by the rib 98, the base member 66 of the flexible resin film is stacked (Step S23), and the color filter, the barrier layer and the like forming the color filter layer 68 are formed further thereon (Step S24). Thus, the second substrate layer 202 is formed on the surface of the support plate 96. As described above, the same material as the base member 56, for example, can be used for the base member 66.

FIG. 4 shows the first substrate layer 200 and the second substrate layer 202 produced by the above processes. Next, the process of assembling these substrate layers into the display panel 40. The counter area part of the second substrate layer 202, that is, the surface of the area surrounded by the rib 98, is a recess part by having the rib 98 formed to be higher than the counter area part. This recess part is filled with the filler 72, using a dispenser or the like (Step S30). Then, for example, the support plate 96 is horizontally placed, with the surface where the second substrate layer 202 is formed facing upward, and the support plate 90 is overlaid on the support plate 96, with the surface where the first substrate layer 200 is formed facing downward. Then, the first substrate layer 200 and the second substrate layer 202 are bonded together into the state shown in FIG. 5 (Step S31).

Here, the filler 72 may fill the gap between the two substrate layers when the first substrate layer 200 and the second substrate layer 202 are bonded together. That is, the filler 72 need not necessarily be spread on the entire surface of the recess part at the stage of Step S30. For example, the filler 72 may be scattered inside the recess part in Step S30, and the filter 72 can be evenly spread in the gap when the two substrate layers are bonded in a vacuum.

Also, a filler 100 may be scattered in the area opposite the margin area 94 of the first substrate layer 200, of the second substrate layer 202, and may be used as a spacer for maintaining the gap between the two substrate layers at the part corresponding to the non-display area 48 of the element substrate 42.

After the fillers 72, 100 are hardened, the joined body of the substrate layers 200, 202 is divided together with the support plates 90, 96 into the respective display panels 40 by using the scribe and break technique (Step S32). Specifically, each of the support plates 90, 96 is scribed and the substrate layers are flexed and broken together with the support plates.

Scribe lines are formed along the ribs 92, 98. Particularly, at the part where the rib is shared among the element substrates 42 adjacent to each other in the first substrate layer 200, or the counter substrates 44 adjacent to each other in the second substrate layer 202, the scribe line is set within the width of the rib, so that the rib is left on both adjacent substrates after breaking. In this embodiment, such a shared part of the rib is the part extending in the direction of length, of the ribs 92, 98 shown in FIG. 6.

Meanwhile, at the part of the rib that is not shared among the element substrates 42 adjacent to each other in the first substrate layer 200 or the counter substrates 44 adjacent to each other in the second substrate layer 202, the scribe line may be set along the edge on the side of the rib that is not adjacent to the element substrate 42 or the counter substrate 44, so that, at this part, the rib is left in its full width on the adjacent substrate. In this embodiment, such a non-shared part of the rib is the part extending in the direction of width, of the ribs 92, 98 shown in FIG. 6. However, the scribe line is set within the width of the rib at this part as well, thus achieving a narrower frame. Specifically, scribe lines are set at the positions $\alpha 1$, $\alpha 2$ on the first substrate layer 200 and the positions $\beta 1$, $\beta 2$ on the second substrate layer 202 shown in FIG. 5, and the substrate layers are then broken.

The ribs 92, 98 after the breaking form the outer peripheral end parts 60, 64 of the element substrate 42 and the counter substrate 44, respectively.

Here, the dam material 74 is formed in the area facing a part of a rib 98a shown in FIG. 5. The rib 98a is the rib 98 situated at the boundary between the display area 46 and the non-display area 48, and the part of the rib 98a belongs to the counter substrate 44 after the braking. That is, in the case where the scribe line is set within the width of the rib 98a as described above, the forming area for the dam material 74 and the position of the scribe line are adjusted so that the dame material 74 will not protrude to the outside from the position $\beta 2$ of the scribe line. If the dam material 74 is laid across the break position, the dame material 74 may not be divided, or a part 102 that should be removed by the division, of the second substrate layer 202, may remain attached to the element substrate 42 even after the division. On the other hand, if the dam material 74 is held on the inside from the position $\beta 2$ of the scribe line, this part 102 can be easily removed by breaking.

After the breaking, the cover layer 58 and the like stacked on the terminal 52 are removed, exposing the terminal 52. Then, the process of connecting the FPC 54 to the terminal 52, or the like, is carried out.

Subsequently, the support plates 90, 96 are separated from the joined body of the element substrate 42 and the counter substrate 44 divided for each display panel 40 by the breaking (Step S33). For the separation of the support plates, methods such as evaporating the sacrificial layers between the barrier layers 62, 70 and the support plates 90, 96 by laser ablation, or dissolving the sacrificial layers by etching, may be used. After separating the support plates, the protection films 76, 78 are stuck to the back sides of the element substrate 42 and the counter substrate 44. Thus, the structure of the display panel 40 shown in FIG. 2 is basically achieved.

In the embodiment, the case of an organic EL display device is illustrated as a disclosed example of the display device. However, as other application examples, any flat panel display devices can be employed, such as a liquid crystal display device, other types of self-light-emitting display device, electronic paper display device having an electrophoretic element or the like, and quantum dot display device. Also, as a matter of course, display devices of medium and small sizes to large size can be used without any particular limitation.

A person skilled in the art can readily think of various changes and modifications within the scope of the technical idea of the invention, and such changes and modifications should be understood as falling within the scope of the invention. For example, the addition or deletion of a component, or a design change suitably made to the foregoing embodiment by a person skilled in the art, or the addition or omission of a process, or a condition change in the embodiment is included in the scope of the invention as long as such change or the like includes the spirit of the invention.

Also, as a matter of course, other advantageous effects that may be achieved by the configurations described in the embodiment should be understood as being achieved by the invention if those effects are clear from the specification or can be readily thought of by a person skilled in the art.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
   an element substrate including a flexible multilayer structure having a resin film as a base member, and having a display area where a display element is formed;
   a counter substrate including a flexible multilayer structure having a resin film as a base member, and stacked on the display area of the element substrate;
   a filler filling a space between the element substrate and the counter substrate; and
   a pair of protection films sandwiching the element substrate, the counter substrate, and the filler, wherein
   each of the element substrate and the counter substrate has a rib which includes a covalently or ionically bonding inorganic material and which is in contact with an outer peripheral lateral surface of the multilayer structure, and
   an outer peripheral lateral surface of the rib and an outer peripheral lateral surface of one of the pair of protection films are coplanar on a plane that is perpendicular to the multilayer structure.

2. The display device according to claim 1, wherein
   the rib provided at an outer peripheral end part of the element substrate has a thickness greater than a thickness of the element substrate, and
   the rib provided at an outer peripheral end part of the counter substrate has a thickness greater than a thickness of the counter substrate.

3. The display device according to claim 1, wherein the rib includes an inorganic oxide or inorganic nitride.

4. The display device according to claim 1, further comprising a cover layer which covers the display area on the element substrate and continuously extends from above the element substrate to above the rib.

* * * * *